(12) United States Patent
Feiweier et al.

(10) Patent No.: US 9,244,142 B2
(45) Date of Patent: Jan. 26, 2016

(54) METHOD FOR OPERATING A RECEIVING DEVICE FOR MAGNETIC RESONANCE IMAGE SIGNALS OF A BODY

(71) Applicants: Thorsten Feiweier, Poxdorf (DE); Thorsten Speckner, Erlangen, DE (US)

(72) Inventors: Thorsten Feiweier, Poxdorf (DE); Thorsten Speckner, Erlangen, DE (US)

(73) Assignee: Siemens Aktiengesellschaft, Munich (DE)

( * ) Notice: Subject to any disclaimer, the term of this patent is extended or adjusted under 35 U.S.C. 154(b) by 678 days.

(21) Appl. No.: 13/679,782

(22) Filed: Nov. 16, 2012

(65) Prior Publication Data
US 2013/0127462 A1 May 23, 2013

(30) Foreign Application Priority Data
Nov. 17, 2011 (DE) .......................... 10 2011 086 566

(51) Int. Cl.
*G01R 33/48* (2006.01)
*G01R 33/54* (2006.01)
*G01R 33/3415* (2006.01)
*G01R 33/483* (2006.01)

(52) U.S. Cl.
CPC .............. *G01R 33/48* (2013.01); *G01R 33/543* (2013.01); *G01R 33/3415* (2013.01); *G01R 33/4835* (2013.01)

(58) Field of Classification Search
CPC ...................................................... G01R 33/48
USPC .......................................................... 324/309
See application file for complete search history.

(56) References Cited

U.S. PATENT DOCUMENTS

| 4,748,411 | A * | 5/1988 | Holland ................. | G01R 33/56 324/309 |
| 7,176,688 | B2 * | 2/2007 | Sato ................. | G01R 33/34053 324/318 |
| 7,557,575 | B2 * | 7/2009 | Ookawa ............. | G01R 33/5616 324/307 |
| 2004/0051529 | A1 * | 3/2004 | Zhu ..................... | G01R 33/5611 324/318 |
| 2004/0239324 | A1 | 12/2004 | Hardy et al. | |
| 2009/0146658 | A1 * | 6/2009 | McDowell ........... | G01N 24/088 324/309 |
| 2009/0160440 | A1 | 6/2009 | Yui | |
| 2009/0224761 | A1 | 9/2009 | Umeda | |

(Continued)

FOREIGN PATENT DOCUMENTS

DE    10 2004 015 796 A1    12/2004

OTHER PUBLICATIONS

German Office Action dated Nov. 15, 2012 for corresponding German Patent Application No. DE 10 2011 086 566.7 with English translation.

(Continued)

*Primary Examiner* — Rodney Fuller
(74) *Attorney, Agent, or Firm* — Lempia Summerfield Katz LLC

(57) ABSTRACT

A receiving device for magnetic resonance (MR) image signals of a body is operated in an MR system such that for at least one coil element of the receiving device, a space domain, in which a spatial sensitivity of the coil element satisfies a predetermined criterion, is determined. A center frequency and a bandwidth of the MR image signal radiated by the body in the space domain are determined for the space domain. A receive path disposed downstream of the coil element is parameterized for operation at the determined center frequency and with the determined bandwidth.

20 Claims, 3 Drawing Sheets

(56) References Cited

U.S. PATENT DOCUMENTS

| | | |
|---|---|---|
| 2010/0308827 A1 | 12/2010 | Koch et al. |
| 2011/0241669 A1 | 10/2011 | Chen et al. |
| 2013/0272591 A1* | 10/2013 | Xue ............... G06T 11/003 382/131 |
| 2015/0061668 A1* | 3/2015 | Dannels ........ G01R 33/56554 324/309 |

OTHER PUBLICATIONS

German Office Action dated Apr. 28, 2014 for corresponding German Patent Application No. DE 10 2011 086 566.7 with English translation.

* cited by examiner

METHOD FOR OPERATING A RECEIVING DEVICE FOR MAGNETIC RESONANCE IMAGE SIGNALS OF A BODY

This application claims the benefit of DE 10 2011 086 566.7, filed on Nov. 17, 2011, which is hereby incorporated by reference.

BACKGROUND

The present embodiments relate to a method for operating a receiving device for magnetic resonance (MR) image signals of a body.

In an MR system for generating magnetic resonance tomograms, a body that is to be examined (e.g., the body of a human being, an animal, or a material specimen) is introduced into a basic magnetic field that may be generated, for example, by a superconducting magnetic coil. A plurality of gradient fields are superimposed on the basic field, and high-frequency alternating magnetic fields are emitted in order to induce a state in the body, in which the body radiates magnetic or electromagnetic response signals. The frequencies of the response signals of individual volume elements (e.g., voxels) of the body are dependent both on the material properties of the body and on the field strength of the magnetic field prevailing in the voxels. The frequencies are approximately equal to 42 megahertz per tesla. In order to differentiate between individual regions in the body, one of the gradient fields (e.g., the readout gradient field) for this reason effects a frequency encoding, by which voxels emit response signals along a frequency encoding axis. The center frequencies of the response signals may differ from one another by several hundred kilohertz, irrespective of the material properties.

The high-frequency signal mix emitted in total by the voxels of the body (e.g., MR image signals) is received by a plurality of receive coil elements (e.g., coil elements) and converted into electrical MR image signals. A coil element may include, for example, a wound wire. The electrical MR image signals of the coil elements are supplied to a signal processing entity, using which the electrical MR image signals are amplified, filtered and downmixed by mixers into a baseband frequency range. Both analog and digital processing may be performed. The downmixing or demodulation may be performed in two stages, with the MR image signals first being demodulated into an intermediate frequency range. The totality of circuit elements connected downstream of the coil elements may be, for example, the receive path.

The coil elements may be arranged as close as possible to the body that is to be examined. For this purpose, the coil elements may, for example, be attached to the body of a patient with the aid of a bandage or be installed in a table on which the patient lies during the examination. For example, the coil elements are no further than 30 cm away from the body. In one embodiment, the coil elements are arranged closer than 15 cm to the body. For each examination, the coil elements therefore have a different relative position with respect to the body that is to be examined. The orientation and strength of the gradient fields may also be freely set for each examination. The coil elements and the receive paths disposed downstream of the coil elements therefore are to be able to receive and process MR signals of every possible center frequency and bandwidth.

State-of-the-art receiving devices for MR systems (e.g., MR scanners) are equipped with ever more powerful gradient systems in order to satisfy the demand for faster image acquisition. In addition to the maximum gradient ascent rate (e.g., slew rate), where there are often already constraints due to physiological limits, the maximum gradient amplitude is the main performance parameter. During the data reception, the MR signals are to be transmitted amplitude- and phase-true using the full frequency encoding bandwidth. Even higher demands on the processing bandwidth of the receive paths may emerge during the multiband detection. In this case, a plurality of layers (e.g., generally parallel layers) of the body at a spatial distance are excited simultaneously, and the respective signals of all of the layers are detected simultaneously. The signal of each of the individual layers is separated by way of an additional frequency encoding along the layer normal. In addition to the readout gradient in the frequency encoding direction, a further gradient is therefore switched along the layer normal direction. The amplitudes of the two gradients and the spatial distance of the layers are coordinated with one another specifically such that the MR image signals of the individual layers are shifted into separate frequency bands. The required bandwidth is therefore multiplied by the number of layers read out simultaneously.

In order to allow the use of coil elements that deliver good image quality in a freely selectable position and for any desired excitation signals and readout gradients in an examination, the coil elements and the components of the downstream receive paths (e.g., the amplifiers, cables, connectors, switch matrices, filters, and analog/digital converters (A/D converters)) therefore support the maximum possible receive width at all times. This makes MR systems very complicated and resource-intensive in manufacturing terms and results in commensurately high production costs.

SUMMARY AND DESCRIPTION

The present embodiments may obviate one or more of the drawbacks or limitations in the related art. For example, a large transmission bandwidth of a receiving device in a magnetic resonance (MR) system is provided, and the manufacturing overhead and the production costs may be kept to a minimum.

One embodiment of the method is used for operating a receiving device for MR image signals of a body. The receiving device may have a plurality of coil elements that may form a receive coil array. According to the method, prior to an impending examination of the body, a space domain, in which a spatial sensitivity of the coil element satisfies a predetermined criterion, is determined in relation to at least one coil element of the receiving device. The spatial sensitivity specifies how clearly an MR signal of a voxel of the body may be received by the coil element and converted into an electrical MR signal. The sensitivity may be used, for example, to specify a signal-to-noise ratio (SNR) or an attenuation. The spatial sensitivity is at least partially a function of the distance of the individual space regions from the receive coil. The criterion accordingly specifies for individual space regions whether the coil element is able to receive MR signals from the respective space region with a predetermined quality. All regions satisfying the criterion form the space domain.

According to the method, which center frequencies and which bandwidths have the MR image signals that, in the forthcoming examination, may radiate from voxels of the body that are located in the space domain are determined in relation to the space domain having the acceptable receive quality. Following this, the receive path that is disposed downstream of the coil element is parameterized for operation at the determined center frequency and with the determined bandwidth.

The method therefore affords the advantage that the receive path may be formed from convenient, narrowband components, without the necessity to accept compromises in terms of the quality of the images recorded. This is because the components are not required to be suitable for the entire receive bandwidth resulting during the examination of the body. The components may be controlled to receive MR image signals in a frequency sub-band. The frequency sub-band determined in relation to the space domain may be much narrower than the overall receive bandwidth, with the result that in such a narrow frequency sub-band, using convenient components, a high linearity of the amplitude response, a high phase fidelity, and an adequate symmetry in the amplitude and phase frequency response may be achieved.

The criterion is used in each case to specify in relation to which space domain it makes sense to receive MR image signals from the body using the coil element. For example, a start and an end of the space domain along the frequency encoding axis specified by the readout gradient field is determined by the criterion. The MR image signals of more remote voxels of the body may be so weak that the MR image signals may not be received with a sufficiently high SNR. This dependence on distance may be turned to good account, since the center frequency of an MR image signal of a voxel is a function of the position of the voxel along the frequency encoding axis.

In connection with the already described multiband imaging, boundaries of the space domain along the layer normal direction may also be determined by the criterion.

The determination of the space domain may include determining the space domain on the basis of a spatial sensitivity profile created in relation to the body and to the current arrangement of the coil elements on the body through acquisition of specimen data. Thus, for example, an overview image may be recorded. Such an overview image may be obtained in a relatively short time by an MRT system, so the duration of the examination will only be extended to an insignificant degree. Only a one-dimensional projection of the body along the frequency encoding direction (this would correspond to a "one-dimensional image"), however, may be determined. A projection may be recorded much faster than a complete image.

During the determination of the space domain, whether space domain is not too small as a result of, for example, too low an SNR during the acquisition of the overview image or input errors with respect to the position of the coil element is determined. With relation to the space domain, a scaling of the spatial extension may be specified (e.g., minimum dimensions). This approach thus advantageously prevents too small a sensitive space domain from being specified on the basis of an estimated threshold value in the case of a high noise level.

If there is prior knowledge concerning the sensitivity profile, this information may be used. Characteristic data relating to a receive profile of the coil element and geometric data relating to the relative position of the coil element with respect to the body may be used.

The form in which the receive path is parameterized is dependent on the embodiment of the MRT system and, for example, on the embodiment of the receiving device. At least one of the following control parameters may be set as a function of the determined center frequency and of the determined bandwidth: a resonant frequency of a detuning device of the coil element, filter coefficients of at least one filter (e.g., a lowpass filter connected upstream of an A/D converter), a demodulation frequency of a mixer, and a sampling parameter of an A/D converter. Low-cost variants of the components that may be adjusted to different center frequencies and band-widths by way of control parameters and have a high transmission quality in the range of the bandwidths set in that way are available.

The method may not be limited to specifying the receive path for a coil element. In one embodiment, the receive paths of a plurality of coil elements are parameterized in the above-cited way, and by this, the receive paths of at least two coil elements are set for the purpose of processing MR image signals from different space domains. In other words, in the method, not every coil element is used for receiving and processing the MR receive signals of all regions of the body. Each coil element and the associated downstream receive path are used to evaluate the MR image signals for one part of the body only (e.g., the respective space domain).

This results in the advantage that the full receive bandwidth of all of the MR image signals may be received and processed by the totality of coil elements and the associated receive paths, and low-cost, narrowband components are provided for this purpose.

In order to produce a magnetic resonance tomogram relating to the body from these sub-band signals of the individual receive paths, in one embodiment of the method, the tomogram may be assembled from a plurality of partial images showing different regions of the body and obtained on the basis of MR image signals of different coil elements.

Although in the method, the individual receive paths process MR image signals of different frequency sub-band widths, the circuitry or switching complexity of the MRT system may not be increased. Instead, the switch matrices that are often present in MRT systems may be used. Via the switch matrices, even in conventional MRT systems, MR image signals of individual coil elements may be supplied to one out of a plurality of A/D converters and/or mixers. In this connection, such a switch matrix may be switched as a function of center frequencies and/or bandwidths determined in relation to a plurality of coil elements. In this way, based on a presorting of the receive channels according to the center frequency, receive channels of identical center frequency are placed using the switch matrix onto A/D converters having a numerically controlled oscillator (NCO). In one embodiment, channels having center frequencies that, though not identical, are very similar in comparison with the bandwidths are also assigned to channels of A/D converters having an NCO. The bandwidth of the A/D converter is adjusted in accordance with the peak-to-peak variation of the bandwidths (e.g., to increase the bandwidth).

The method also permits receiving devices having a plurality of coil elements to be freely arranged on a body and also the gradient fields to be aligned in a way that is favorable for the examination of the body. One embodiment of an MRT system includes a receiving device for MR image signals having a fixed encoding axis with a fixed readout gradient direction. The MRT system may be provided at exceptionally low cost. A plurality of coil elements of the receiving device are arranged in fixed positions along the frequency encoding axis. The center frequencies of the frequency responses are different from one another in the coil elements and/or the respective downstream receive paths. Moreover, the individual coil elements and/or the receive paths are configured for operation at center frequencies (e.g., also with bandwidths) that are dependent on the position of the coil element along the frequency encoding axis. Since the frequency encoding axis and also a readout gradient direction of the frequency encoding axis are fixed, it is consequently not necessary in the case of this MRT system to reparameterize the receive paths each time for sequential examinations. Accordingly, the components of the MRT system may already be selected or permanently set in a targeted manner for operation at the predetermined center frequencies and bandwidths while the MRT system is in production. This approach may be applied for imaging in an inhomogeneous magnetic field (e.g., when the basic magnetic field (already without switching of gradient fields) is spatially inhomogeneous). If, for example, the amplitude of the basic magnetic field decreases continuously along a space direction, then a plurality of coil elements having different center frequencies may be positioned along the space direction in order to detect the respective local MR signal.

DETAILED DESCRIPTION OF THE DRAWINGS

Figure 1:
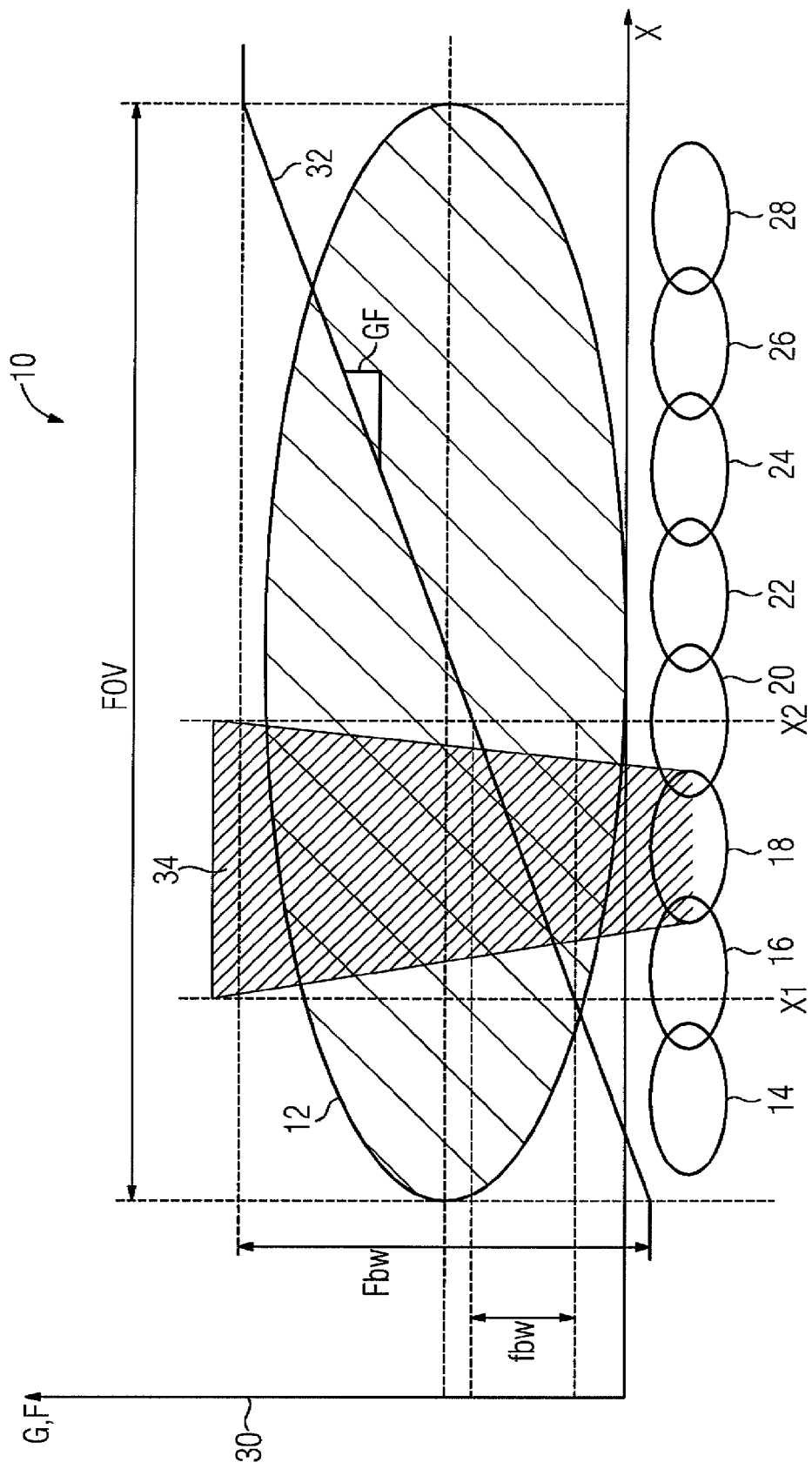
FIG. 1 shows a schematic representation of one embodiment of a magnetic resonance tomograph.

FIG. 1 shows one embodiment of a magnetic resonance tomography system or tomograph 10 and a basic magnetic field or BO field. A body 12 of a patient is in the magnetic resonance tomography system 10. Receive coils 14 to 28 of a receiving device of the tomograph 10 are arranged close to the body 12. The receive coils 14 to 28 may be contained in a common housing. The receive coils 14 to 28 may form a coil array. The receive coils 14 to 28 may be installed, for example, in a patient table, on which the body 12 lies. The receive coils 14 to 28 may also be configured as a portable coil array that may be arranged freely on the body 12.

The body 12 is excited in a known manner, through generation of a plurality of magnetic gradient fields and through emission of a high-frequency alternating magnetic field, into a magnetic resonance, on account of which the body 12 radiates MR image signals. Superimposed on the illustration of the tomograph 10 in FIG. 1 is a diagram 30, in which a graph 32 illustrates a basic variation of a magnetic field strength G of a readout gradient field and the variation of a proportional Lamor frequency or radiation frequency F as a function of the position of the individual voxels along a frequency encoding axis X specified by the readout gradient direction. The field strength G increases along the frequency encoding axis X. This results in a spatial dependence of the radiation frequency F of the material of the body 12. In other words, voxels containing body fat of the body 12 and located in the left-hand part of the body 12 in FIG. 1, for example, radiate MR image signals at a lower radiation frequency F than voxels that contain body fat but are located in the right-hand part of the body 12.

The receive bandwidth Fbw for the totality of MR image signals radiated by the body 12 is calculated from the field encoding gradient Gf that is active during the reception of the data (e.g., the difference formed from the greatest radiation frequency and the smallest radiation frequency and illustrated in FIG. 1 as a slope triangle, as well as from the extension of the body 12 along the frequency encoding axis X). The extension is referred to as the field of view (FOV). The following applies to the total receive bandwidth: $Fbw=\gamma/(2*\pi)*(Gf*FOV)$, where $\gamma$ represents the gyromagnetic ratio. If, for example, it is desired to record a space domain with a field of view of 500 mm with a readout gradient of Gf=40 mT/m, a receive bandwidth Fbw of approximately 850 KHz may be used. If a twofold oversampling is chosen in order to reduce aliasing and wrap-around artifacts, this value increases to 1.7 MHz.

In the case of the tomograph 10, in spite of these high requirements in terms of the total transmission bandwidth Fbw, the requirements to be fulfilled by the individual receive coils 14 to 28 and by the receive paths disposed downstream of the receive coils 14 to 28 are much lower. The extent of the reduction in the requirements is dependent, for example, on the embodiment of the receiving device of the tomograph 10. The more receive coils the receiving device has, the better are the preconditions for reducing the requirements. This principle is based on the knowledge that each coil element "illuminates" a domain that is restricted in the direction of the frequency encoding axis X (e.g., sees with a sufficiently high signal strength or receive quality). A space domain 34 associated with the receive coil 18 is marked in this regard in FIG. 1. The smaller the coil elements are, the smaller also is the spatial domain, from which signals having sufficient receive quality or signal strength are received. If the sensitive spatial domain 34 of the coil 18 thus extends along the frequency encoding axis X (e.g., from X1 to X2), then a reduced bandwidth $fbw=g/(2*\pi)*(Gf*(X2-X1))$ is correspondingly used for processing the signals received by the coil 18. For small coil elements 14 to 28, (X2−X1)<<FOV. The bandwidth requirement for processing the signals of the individual receive coils 14 to 18 may therefore be reduced substantially.

The practical procedure for producing an actual measurement of MR image signals of the body 12 may be provided, as follows. The spatial sensitivity profile of all of the receive coil elements 14 to 28 is determined. This may happen, for example, by recording a quick overview image at low resolution, for which purpose a correspondingly low receive bandwidth is used for all of the coil elements 14 to 28. The data is received simultaneously by all coil elements 14 to 28, the receive bandwidth being chosen such that all of the coils 14 to 28 receive signals from the entire body 12. If there is prior knowledge in relation to the position of the coil elements and the presumed receive profile, this information may be used alternatively or in addition.

The sensitive spatial domain along the frequency encoding axis is determined for each coil element 14 to 28. For the coil 18, this is therefore the domain 34. A threshold value may be used in this case, for example. The domain, in which a signal is detected in, for example, the overview image with a receive intensity above the threshold value, is assumed to be sensitive (e.g., assumed to be suitable for the acquisition using the corresponding coil). Empirical factors (e.g., for scaling the spatial extension of the individual space domains) may be incorporated into this consideration. This is important, for example, when the SNR of the reference measurement (e.g., overview image) is relatively low.

The receive bandwidth fbw and the corresponding center frequency $fm=g/(2*\pi)*0.5\,(Gf(X1+X2))$ are determined for each coil element 14 to 28 with knowledge of the readout gradient that is to be used.

The receive path of each coil element 14 to 28 may be optimized for the respectively determined center frequency of the coil element and the associated receive bandwidth. This optimization may, for example, include an adjustment of the coil tuning if the coil elements may be tuned, an adjustment of the demodulation frequency if an intermediate frequency concept is used, the setting of filter coefficients, or the adjustment of the sampling parameters in an A/D converter.

Figure 2:
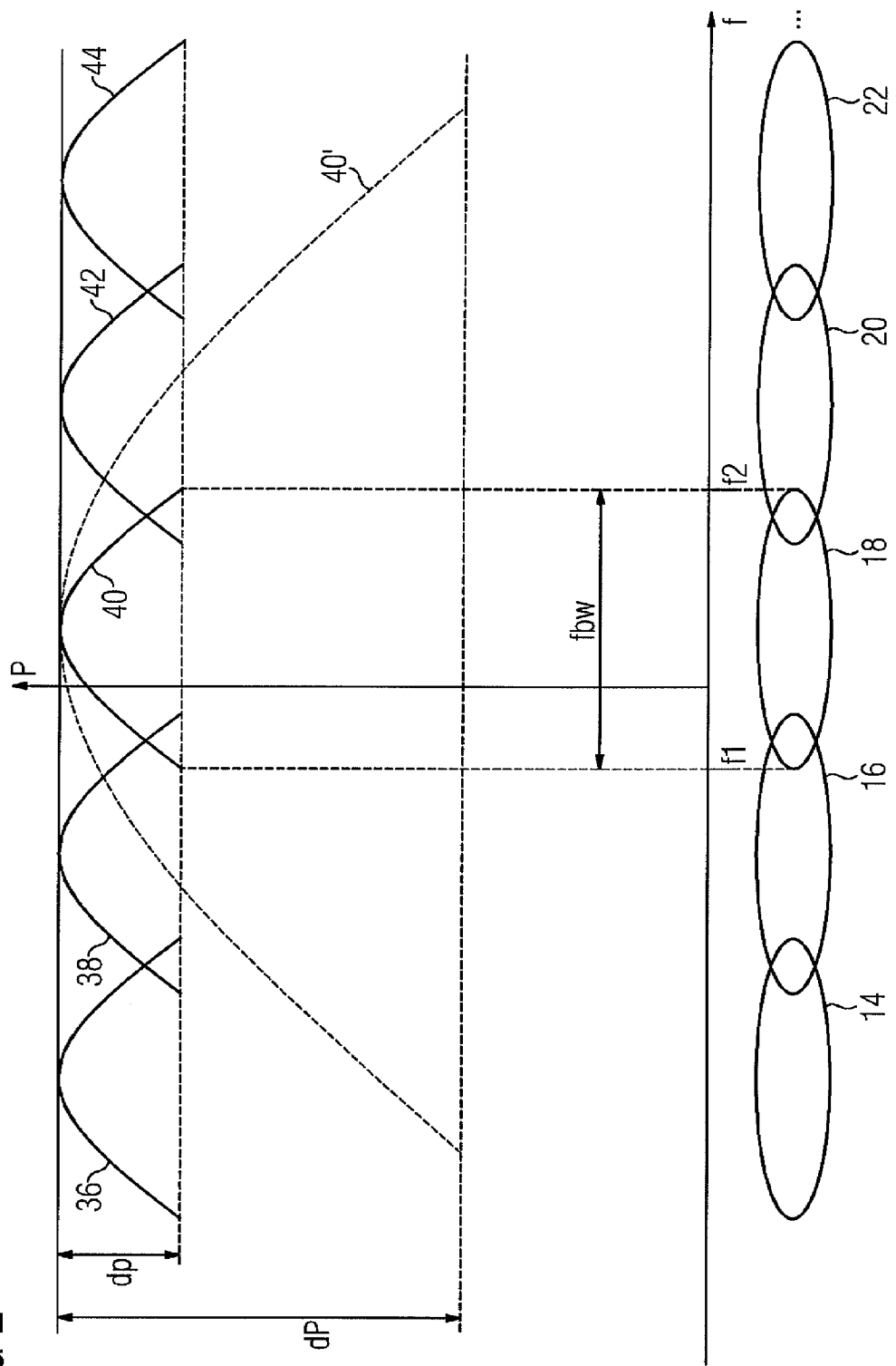
FIG. 2 is a diagram including exemplary phase frequency responses of receive paths of the magnetic resonance tomograph from FIG. 1.

If, for example, a demodulation of the signal on an intermediate frequency is used, only the reduced bandwidth is to be fulfilled for all components operating on this intermediate frequency in the receive path. This may result in better signal transmission characteristics in terms of linearity, phase fidelity and symmetry of the transmission functions. Overall, this leads to an improvement in image quality such as, for example, a reduction in ghosting artifacts and a more homogeneous illumination of the body 12. In order to illustrate this effect, FIG. 2 shows a diagram of exemplary phase responses 36 to 44 associated with the coil elements 14 to 22. The diagram shows basic waveforms of the phase P of transmission functions of the coil elements 14 to 22 and associated downstream receive paths as a function of the frequency f.

Reference is made in the following only to the coil element 18. However, the explanations given also apply to the rest of the coil elements 14 to 28. Since it has been detected as a result of the evaluation of, for example, the sensitivity profile of the coil element 18 and of the receive path disposed downstream thereof that the coil element 18 may only evaluate a space domain 34 in the body 12 that begins at the position X1 in the direction of the frequency encoding axis X and ends at the position X2, only a frequency subdomain fbw that, corresponding to the positions X1 and X2, begins at a frequency f1 and ends at a frequency f2, is processed by the coil element 18 and the associated downstream receive path. In one embodiment, a transmission function with constant phase response is provided for processing the MR image signals of the body 12. Because this may be too complicated technically, however, a deviation of the phase-frequency response 40 over the processed receive frequency range is to be tolerated. Since, however, the frequency range fbw for the coil element 18 is very narrow, this results in a phase deviation dp that is significantly smaller than a phase deviation dP that would result if signals of the entire body 12 were to be processed by the coil element 18. In this regard, for greater clarity of illustration, FIG. 2 also shows a phase-frequency response 40' that would then result.

For the usability of the method, at least two coil elements (e.g., more than two coil elements) having different spatial sensitivity are present along the frequency encoding axis X. The bandwidth reduction may be greater or less, depending on the orientation of the recording volume relative to the receive coil geometry present. The approach described may be combined without problem with multiband encoding methods.

With the multiband encoding methods, a plurality of layers (e.g., generally parallel) at a spatial distance are excited simultaneously, and the individual signals of all of the layers are detected simultaneously. In a postprocessing that is similar to a deconvolution (e.g., the GRAPPA algorithm from the parallel imaging environment), the simultaneously recorded signals are assigned to the individual layers. The method according to the present embodiments may be used to advantage here in two respects.

A reduction in the receive bandwidth may be achieved. For this purpose, similarly to the reduction of the receive bandwidth of individual coil elements during the single frequency encoding along the readout direction, the method is used in an analogous manner to reduce the necessary receive bandwidth along the layer normal direction. At least two coil elements (e.g., more than two coil elements) having different spatial sensitivity are present along the layer normal direction. This is the case, for example, with coil elements that are installed in a receiving device in a matrix arrangement in a two-dimensional field.

The deconvolution aimed at reducing artefacts and increasing the signal to noise ration (SNR) may also be improved in terms of effectiveness. For this purpose, sensitivity profiles are used, for example, as a basis for selecting individual coil elements, with which only signals that are transmitted from a specific layer of the body lying in immediate proximity to the coil are received. For other coil elements, the signal of the layer lies outside of the receive band. This has a positive effect on the deconvolution process. With sufficiently small coil elements, the deconvolution may be omitted in certain cases. Instead, only the signals of the coil elements located close to the respective layer are combined in a targeted manner. The coil elements may be assigned to the layers on the basis of an overview measurement.

In a corresponding embodiment of a tomograph, the method may be performed one time only and not prior to each immediately impending examination. Thus, an MR scanner, in which the frequency encoding axis (e.g., the readout direction) is fixed onto a spatial axis (e.g., the horizontally running X-axis), is provided. A plurality of receive coil elements may be provided along this direction. The polarity of the readout gradient may also be specified (e.g., the spatial orientation of the gradient that is active during the signal detection). In this configuration, the individual coil elements may be optimized on a circuitry level in a targeted manner for a reduced bandwidth range in accordance with the spatial arrangement. The method may be applied over the entire receive path. Restricting the permitted amplitudes for the readout gradient enables the bandwidth range to be reduced even further. The same approach may be adopted in the case of MR systems having an inhomogeneous basic field.

Due to the fact that it is possible to operate with reduced receive bandwidths in the frequency encoding direction, the individual channels are to be processed at different demodulation frequencies or mixing frequencies. In one embodiment, the demodulation takes place into the baseband (e.g., if necessary, after downmixing to an intermediate frequency) in the receiver A/D converter by way of NCOs. The NCOs, which are provided for the majority of the coil elements, are operated on a channel-specific frequency for the demodulation depending on the center frequency of the channel that the coil elements are currently processing. Therefore, a plurality of receive-channel-specific NCOs or NCO groups having a frequency that may be set individually by the measurement system if the frequency encoding direction and the readout gradient may be changed in the tomographs is provided.

The receiving device may include a switch matrix, using which the signals of the individual coil elements may be arbitrarily supplied to the different A/D converters. Based on a presorting of the receive channels according to the center frequency, receive channels of identical center frequency such as may result, for example, for receive coils of one row in the case of a matrix arrangement of receive coils, or receive channels at least having comparable center frequencies may be placed by the switch matrix onto A/D converters having the same sampling parameter.

Figure 3:
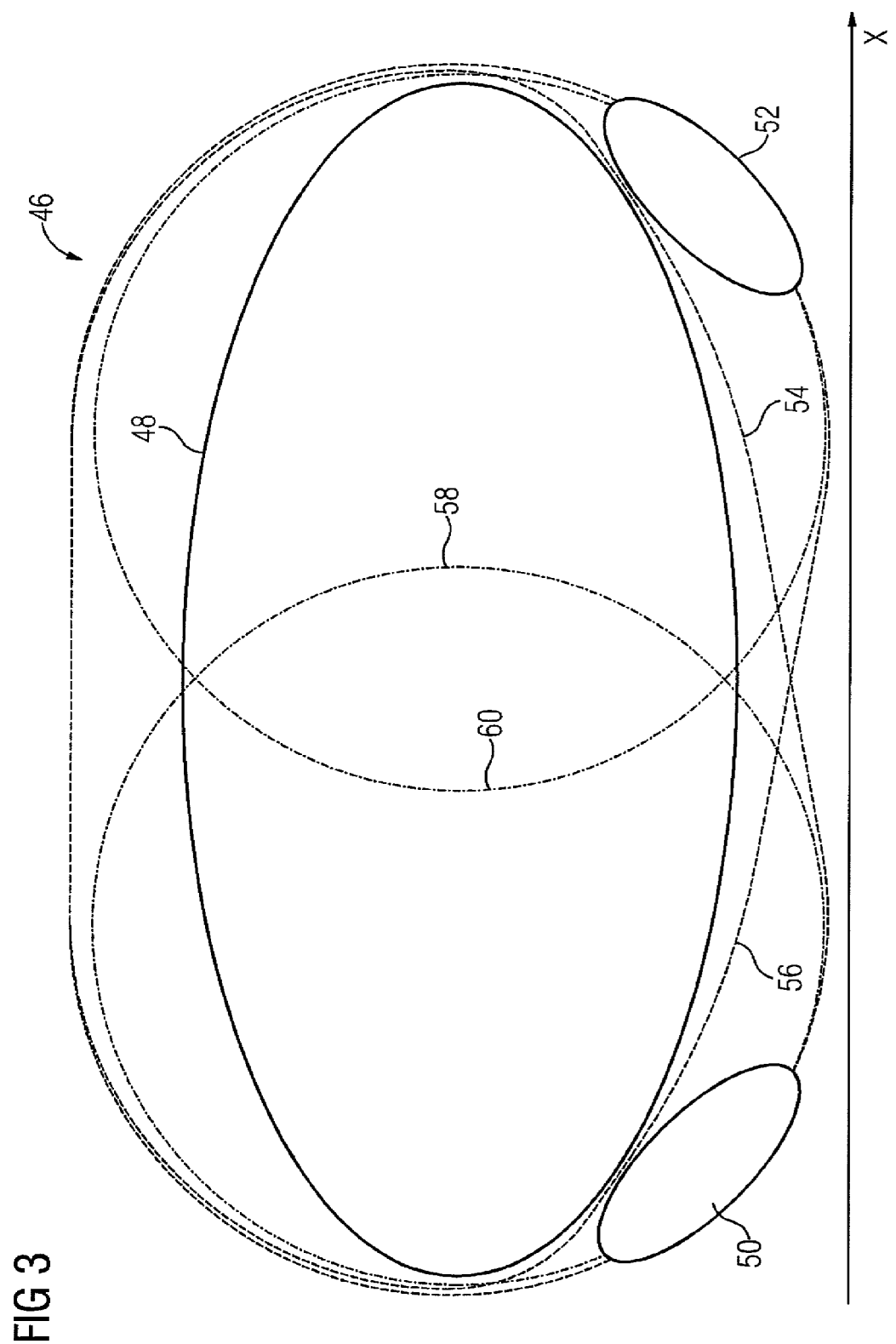
FIG. 3 shows a schematic representation of one embodiment of a magnetic resonance tomogram obtained by the magnetic resonance tomograph from FIG. 1.

The following, with reference to FIG. 3, describes how a tomogram 46 relating to a body 48 may be generated on the basis of one embodiment of the method using two spatially separated coils 50, 52. To provide a better understanding, how the tomogram 46 according to the prior art would be created is described. For this purpose, the signal of the channels of the two coils 50, 52 having, for example, a total receive bandwidth of 130 Hz/pixel*384 pixels=50 KHz may be sampled in a measurement, and the signals of the two coil channels are combined. FIG. 3 shows how a receive domain 54 is produced from this for the coil element 50. The receive domain 54 includes the totality of MR image signals emitted by the body 48. Analogously, the resulting receive domain 56 associated with the coil element 52 is also illustrated. In order to illustrate the principle of operation more clearly, FIG. 3 also shows the corresponding frequency encoding axis X.

According to one embodiment of the method, the signal of the channel of each individual coil element 50, 52 is sampled with a reduced receive bandwidth of only 25 KHz and at an adjusted center frequency in each case. Accordingly, a receive domain 58 of the coil element 50 only encompasses a part of the body 48. A reduced receive domain 60 is also produced for the coil element 52. Consequently, only partial tomograms showing only a part of the body 48 may be generated in each case from the signals of the coil elements 50, 52. The "combination" of the two single images is realized, for example, by presenting the single images next to each other. For example, when the partial tomograms have a spatial overlap, more complex combination methods from the prior art may be used (e.g., the "sum of squares" technique). The resulting overall tomogram 46 possesses a comparable quality to the tomogram generated in accordance with the prior art, although in the case of the measurement based on the method according to the present embodiments, the requirements to be met by the receive system have been reduced by a factor of 2 (e.g., receive bandwidth of 25 KHz instead of 50 KHz).

Advantages that may be achieved by the method include: utilization of the different coil sensitivity profiles along the frequency encoding direction; virtual expansion of the available maximum receive bandwidth by operating narrowband components in parallel at different center frequencies; cost reduction on account of less stringent requirements in terms of the transmission characteristics of the receive components; improvement in image quality through optimization of the receive path of individual coil elements on the relevant bandwidth ranges; reduction in noise levels in processing steps preceding the first Fourier transform; and higher robustness during deconvolution when using multiband encoding techniques.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a receiving device for magnetic resonance (MR) image signals of a body, the method comprising:
   determining a space domain for at least one coil element of the receiving device, a spatial sensitivity of the at least one coil element in the space domain satisfying a predetermined criterion;
   determining a center frequency and a bandwidth of an MR image signal emitted by the body for the space domain; and
   parameterizing a receive path disposed downstream of the at least one coil element for operation at the center frequency and with the bandwidth.

2. The method as claimed in claim 1, further comprising determining a start and an end of the space domain along a frequency encoding axis specified by a readout gradient field on the basis of the predetermined criterion.

3. The method as claimed in claim 2, wherein determining the space domain comprises determining the space domain on the basis of a spatial sensitivity profile that is created in relation to the body and to a current arrangement of the at least one coil element on the body through acquisition of specimen data.

4. The method as claimed in claim 2, wherein determining the space domain comprises determining the space domain on the basis of a spatial sensitivity profile that is created as a function of characteristic data relating to a receive profile of the at least one coil element, relating to a relative position of the at least one coil element with respect to the body, or relating to the receive profile of the at least one coil element and the relative position of the at least one coil element with respect to the body.

5. The method as claimed in claim 2, further comprising specifying a scaling of a spatial extension in relation to the space domain.

6. The method as claimed in claim 2, wherein parameterizing the receive path comprises setting at least one control parameter, the at least one control parameter comprising a resonant frequency of a detuning device of the at least one coil element, filter coefficients of a filter, a demodulation frequency of a mixer, a sampling parameter of an A/D converter, or a combination thereof.

7. The method as claimed in claim 2, further comprising parameterizing receive paths of a plurality of coil elements for operation at the center frequency and with the bandwidth, the receive path comprising the receive path, the at least one coil element comprising the plurality of coil elements; and
   setting the receive paths of at least two coil elements of the plurality of coil elements for the purpose of processing MR image signals from different space domains of the body, the different space domains comprising the space domain.

8. The method as claimed in claim 2, further comprising producing a magnetic resonance tomogram from a plurality of partial images showing different regions of the body and obtained on the basis of MR image signals of different coil elements, the at least one coil element comprising the different coil elements.

9. The method as claimed in claim 1, further comprising determining a start and an end of the space domain along a layer normal direction specified by a multiband imaging method on the basis of the predetermined criterion.

10. The method as claimed in claim 9, wherein determining the space domain comprises determining the space domain on the basis of a spatial sensitivity profile that is created in relation to the body and to a current arrangement of the at least one coil element on the body through acquisition of specimen data.

11. The method as claimed in claim 9, wherein determining the space domain comprises determining the space domain on the basis of a spatial sensitivity profile that is created as a function of characteristic data relating to a receive profile of the at least one coil element, relating to a relative position of the at least one coil element with respect to the body, or relating to the receive profile of the at least one coil element and the relative position of the at least one coil element with respect to the body.

12. The method as claimed in claim 1, wherein determining the space domain comprises determining the space domain on the basis of a spatial sensitivity profile that is created in relation to the body and to a current arrangement of the at least one coil element on the body through acquisition of specimen data.

13. The method as claimed in claim 1, wherein determining the space domain comprises determining the space domain on the basis of a spatial sensitivity profile that is created as a function of characteristic data relating to a receive profile of the at least one coil element, relating to a relative position of the at least one coil element with respect to the body, or relating to the receive profile of the at least one coil element and the relative position of the at least one coil element with respect to the body.

14. The method as claimed in claim 1, further comprising specifying a scaling of a spatial extension in relation to the space domain.

15. The method as claimed in claim 1, wherein parameterizing the receive path comprises setting at least one control parameter, the at least one control parameter comprising a resonant frequency of a detuning device of the at least one coil element, filter coefficients of a filter, a demodulation frequency of a mixer, a sampling parameter of an A/D converter, or a combination thereof.

16. The method as claimed in claim 1, further comprising parameterizing receive paths of a plurality of coil elements for operation at the center frequency and with the bandwidth, the receive path comprising the receive path, the at least one coil element comprising the plurality of coil elements; and setting the receive paths of at least two coil elements of the plurality of coil elements for the purpose of processing MR image signals from different space domains of the body, the different space domains comprising the space domain.

17. The method as claimed in claim 1, further comprising producing a magnetic resonance tomogram from a plurality of partial images showing different regions of the body and obtained on the basis of MR image signals of different coil elements, the at least one coil element comprising the different coil elements.

18. The method as claimed in claim 1, further comprising switching a switch matrix as a function of center frequencies, bandwidths, or the center frequencies and the bandwidths determined in relation to a plurality of coil elements, the at least one coil element comprising the plurality of coil elements, the MR image signals of the plurality of coil elements being supplied to one A/D converter of a plurality of A/D converters, mixers, or the one A/D converter and the mixers via the switch matrix.

19. A magnetic resonance tomography (MRT) system comprising:

a receiving device for MR image signals having a fixed frequency encoding axis with a fixed readout gradient direction, a plurality of coil elements of the receiving device being arranged along the frequency encoding axis, the plurality of coil elements, respective receive paths disposed downstream of the coil elements, or both the coil elements and the downstream receive paths being configured for operation at center frequencies, the center frequencies being dependent on the position of the coil element along the frequency encoding axis.

20. An magnetic resonance tomography (MRT) system comprising:

a receiving device for MR image signals having an inhomogeneous basic field; and a plurality of coil elements of the receiving device arranged along an axis specified by a gradient of the inhomogeneity, the plurality of coil elements, respective receive paths disposed downstream of the plurality of coil elements, or the plurality of coil elements and the respective receive paths being configured for operation at center frequencies that are dependent on positions of the plurality of coil elements along the axis.

* * * * *